United States Patent
Suzuki et al.

(10) Patent No.: US 6,818,941 B1
(45) Date of Patent: Nov. 16, 2004

(54) THIN FILM ELECTRON EMITTER, DISPLAY DEVICE USING THE SAME AND APPLIED MACHINE

(75) Inventors: Mutsumi Suzuki, Kodaira (JP); Toshiaki Kusunoki, Tokorozawa (JP); Masakazu Sagawa, Inagi (JP); Makoto Okai, Tokorozawa (JP); Akitoshi Ishizaka, Chiba (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/979,740

(22) PCT Filed: May 28, 1999

(86) PCT No.: PCT/JP99/02840

§ 371 (c)(1), (2), (4) Date: Nov. 28, 2001

(87) PCT Pub. No.: WO00/74098

PCT Pub. Date: Dec. 7, 2000

(51) Int. Cl.⁷ ............................................. H01L 31/119
(52) U.S. Cl. .................... 257/310; 257/198; 257/588; 257/592
(58) Field of Search ................................ 257/198, 310, 257/588, 592; 313/310, 495

(56) References Cited

U.S. PATENT DOCUMENTS

| | | | |
|---|---|---|---|
| 6,130,503 A | * | 10/2000 | Negishi et al. ............. 313/495 |
| 6,404,124 B1 | * | 6/2002 | Sakemura et al. .......... 313/495 |
| 6,472,803 B1 | * | 10/2002 | Yoshizawa et al. ......... 313/310 |
| 2002/0047513 A1 | * | 4/2002 | Nomura ...................... 313/495 |

FOREIGN PATENT DOCUMENTS

| JP | 56-17780 | 3/1973 |
|---|---|---|
| JP | 01-298623 | 5/1988 |
| JP | 2-715304 | 5/1988 |
| JP | 07-057619 | 8/1993 |
| JP | 07-065710 | 8/1993 |
| JP | 08-115655 | 10/1994 |
| JP | 09-320456 | 11/1996 |
| JP | 09-320450 | 3/1997 |
| JP | 11-162328 | 11/1997 |

OTHER PUBLICATIONS

Kuniyoshi Yokoo, Kiroshi Tanaka, Shinji Sato, Junichi Murota and Shoichi Ono, "Emission Characteristics of Metal–Oxide–Semiconductor Electron Tunneling Cathode", 1993 American Vacuum Society, J. Vac. Sci. Technol. B 11(2), Mar./Apr. 1993, pp. 429–432.

Nobuyasu Negishi, Takashi Chuman, Shingo Iwasaki, Takamasa Yoshikawa, Hiroshi Ito and Kiyohide Ogasawara, "High Efficiency Electron–Emission in $Pt/SiO_x/Si/Al$ Structure", Jpn. J. Appl. Phys. vol. 36 (1997) pp. 939–941.

Nobuyoshi Koshida, Tsuyoshi Ozaki, Xia Sheng and Hideki Koyama, "cold Electron Emission from Electroluminescent Porous Silicon Diodes", Jpn. J. Appl. Phys. vol. 34 (1995) pp. 705–707.

* cited by examiner

*Primary Examiner*—David Nelms
*Assistant Examiner*—Dao H. Nguyen
(74) *Attorney, Agent, or Firm*—Reed Smith LLP; Stanley P. Fisher, Esq.; Juan Carlos A. Marquez, Esq.

(57) ABSTRACT

As the top electrode material of a thin-film electron emitter, a material having a bandgap wider than that of Si and electrical conductivity is used. In particular, a conductive oxide such as an $SnO_2$ or ITO film and a wide-bandgap semiconductor such as GaN or SiC are employed.

The electron energy loss in a top electrode through which hot electrons pass can be reduced so as to enhance the electron emission efficiency.

A high emission current can be obtained in the case of the same diode current as a prior art. In addition, in the case of the same emission current density as a prior art, a small driving current is enough. A bus line and driving circuits can be simplified.

46 Claims, 12 Drawing Sheets

BEFORE SCATTERING    AFTER SCATTERING

US 6,818,941 B1

THIN FILM ELECTRON EMITTER, DISPLAY DEVICE USING THE SAME AND APPLIED MACHINE

TECHNICAL FIELD

The present invention relates to a thin-film electron emitter having an electrode-insulator-electrode or an electrode-semiconductor-insulator-electrode stacked structure for emitting electrons into a vacuum, a display device using the same, and an applied machine such as an electron-beam lithography apparatus.

BACKGROUND ART

A thin-film electron emitter according to the present invention is an electron emission element using hot electrons generated by applying a high electric field to an insulator. As a typical example, an MIM (Metal-Insulator-Metal) electron emitter constructed by a thin film having a three-layer structure of the top electrode-insulator-base electrode will be explained. This applies voltage between the top electrode and the base electrode to emit electrons from the surface of the top electrode. The MIM electron emitter is disclosed in, for example, Japanese Laid-Open Patent Publication No. Hei 7-65710.

FIG. 2 shows the operating principle of an MIM electron emitter which is a typical example of a thin-film electron emitter. A driving voltage 20 is applied between a top electrode 11 and a base electrode 13 so that the electric field in an insulator 12 is above 1 to 10 MV/cm. Electrons near the Fermi level in the base electrode 13 pass through the barrier by tunneling phenomena and are injected into the conduction band of the insulator 12 and the top, electrode 11 so as to become hot electrons. Part of these hot electrons is scattered by the interaction thereof with a solid in the insulator 12 and the top electrode 11 and loses energy. As a result, at time of reaching the interface between the top electrode 11 and a vacuum 10, there are hot electrons having various energies. Of these hot electrons, the hot electrons having an energy above the work function $\phi$ of the top electrode 11 are emitted into the vacuum 10. Other hot electrons are flowed into the top electrode 11. An electric current flowing from the base electrode 13 to the top electrode 11 is called a diode current Id, and an electric current emitted into the vacuum 10 is called an emission current Ie. An electron emission efficiency Ie/Id is about $1/10^3$ to $1/10^5$. Electron emission by this principle in, for example, an An-Al$_2$O$_3$-Al structure is observed. The electron emitter has excellent electron emitter properties in that even when the surface of the top electrode 11 is contaminated due to attachment of ambient gas to change the work function $\phi$, this will not greatly affect the electron emission characteristic, and is expected as a new electron emitter.

DISCLOSURE OF THE INVENTION

As described above, the electron emission efficiency Ie/Id of a thin-film electron emitter is typically low and about $1/10^3$ to $1/10^5$. In order to obtain a desired emission current Ie, the diode current Id must be increased. There is the problem that the capacity of a bus line feeding an electric current to the electron emitter must be high, and the high output electric current of a driving circuit is needed. In particular, when plural thin-film electron emitters are arranged in two dimensions for use, plural electron emitters are connected to one bus line, therefore, the high electric current is a significant problem. Further, in order to flow a large amount of the diode current, a higher electric field must be applied to the insulator. This can shorten the operating life of the thin-film electron emitter.

An object of the present invention is to increase the electron emission efficiency of a thin-film electron emitter. The reason why the electron emission efficiency is low is that, as described in connection with FIG. 2, hot electrons are scattered in the insulator and the top electrode and lose energy. The percentage of contribution of the insulator and the top electrode to scattering depends on various conditions of the thin-film electron emitter structuring material and the film thickness of the insulator and the top electrode. Although not generally evaluated, in any case, it is certain that the scattering in the top electrode considerably contributes to the electron emission efficiency. When using a top electrode material with a low occurrence probability of hot electron scattering, the electron emission efficiency is enhanced. We have found from various studies that the degree of hot electron scattering is associated with density of states of an electrode material. More specifically, as the density of states near the Fermi level of a material is low, the probability of hot electron scattering is decreased, and the electron emission efficiency of a thin-film electron emitter using the same is enhanced.

This will be explained as follows. The hot electron scattering in a solid is governed chiefly by electron—electron scattering. FIG. 3 is a diagram schematically showing the energy states of electrons in a metal before and after scattering. An electronic state of a hot electron before scattering is indicated by 1, and its energy is indicated by $E_1$, interacting with an electron in a state 2.

The state below Fermi level $E_F$ is occupied by electrons. States 3 and 4 of two electrons after scattering can only be states above the $E_F$. Providing energy references with respect to the Fermi level, the law of energy conservation gives:

$$E_1 + E_2 = E_3 + E_4 > 0$$

In other words, the hot electron of the energy $E_1$ can interact with only a valence electron in the range of 0 to $-E_1$, and can only be a state in the range of 0 to $E_1$ after scattering. The hot electron scattering probability is in almost proportion to the number of densities of states D(E) in this range.

In order to,actually measure a difference in electron scattering degrees between metal materials, we have made samples in which the top electrode 11 of an MIM electron emitter is structured by a double-layer film of M—Au (M=Au, Pt, Ir, Mo, or W) to measure electron emission efficiencies. As shown in FIG. 4, the electron emission efficiencies are increased in the order of W, Mo, Ir, Pt and Au. FIG. 5 shows densities of states of these metal materials. The number of densities of states existing in the range of -7 eV to +7 eV is decreased in the order of W, Mo, Ir, Pt and Au. In this way, we have found the above-mentioned association of the hot electron scattering degree with the density of states of the materials.

A top electrode material with a low occurrence probability of hot electron scattering is found to have a low density of states near the Fermi level. In other words, it is understood that a material having a wide-bandgap near the Fermi level is particularly desirable.

An example in which n$^+$-Si frequently used as an electrode material in a semiconductor process is employed for the top electrode of a thin-film electron emitter is reported in Journal of Vacuum Science and Technologies B, Vol. 11, pp. 429 to 432. In this document, this structure cannot obtain a sufficient emission efficiency. This shows that the Si bandgap (1.1 eV) is not enough to reduce the electron scattering probability.

With the above-mentioned studies, we have found the following materials as materials optimal for the top electrode material of a thin-film electron emitter. In other words, they have a bandgap wider than that of Si. The top electrode which flows a diode current must have low resistance.

As such materials, there are particularly conductive oxides. Among these, a group of materials called a transparent conductive film have a bandgap above about 3 eV to prevent light absorption and are suitable for the top electrode of a thin-film electron emitter since the resistivity is about $1\times10^{-4}$ to $8\times10^{-4}$ $\Omega$cm, the resistivity is below $10^{-3}$ $\Omega$cm, and the conductivity is high. More specifically, typical examples include tin oxide, Sb-doped tin oxide, Sn-doped indium oxide (ITO, Indium Tin Oxide film), zinc oxide, and $Cd_2SnO_4$.

Examples of other conductive oxides include non-doped indium oxide, F-doped indium oxide, CdO, TiO2, CdIn2O4, Cd2SnO2, Zn2SnO4, and Al-, Ga-, or In-doped zinc oxide.

The resistivity of these materials is about 100 times higher than that of a metal such as Au. The resistivity is low enough in the case that an electric current is fed to the electron emission region by a bus line, and the area of the electron emission region is about tens to hundreds of $\mu$m square. A requirement for the electrode resistance is determined whether the voltage drop due to electric current passage is within a desired range or not. When the length of a shorter side of the top electrode is L, the required resistance value is changed by dependence of $L^{-1}$ to $L^{-2}$. When a metal is used for the top electrode, it is possible to realize a thin-film electron emitter having an electron emission region area of about 1 mm square. When the electron emission region area is about tens to hundreds of $\mu$m square, 100-times resistivity can be allowed.

As other optimum materials, there are so-called wide-bandgap semiconductors such as GaN or SiC. These having a bandgap above 3 eV are enough, and can enhance the conductivity by impurity doping. These are suitable for the top electrode of a thin-film electron emitter.

As other transparent conductive films, there are conductive borides and conductive nitrides. Specifically, there is LaB6 as the conductive boride, and there are TiN, ZrN, and HfN as the conductive nitride. In the conductive boride and the conductive nitride, the density of states (DOS) in the range of about 3 eV immediately below the Fermi level is extremely low. Since the DOS in this energy range is not zero, they cannot be necessarily called a wide-bandgap material. Since the DOS is extremely low, the probability of hot electron scattering is low by the above-mentioned principle, so that they are suitable for the top electrode of a thin-film electron emitter. Further, these compounds have the advantage that since the work function of the surface is low and about 2.6 to 4 eV, electron emission from the surface easily occurs.

When desiring to decrease the resistivity depending on the application, a metal such as Au or Pt having a low density of states near the Fermi level may be stacked on the above-mentioned material having a bandgap wider than the Si bandgap. In this case, the electron emission efficiency is naturally lowered as compared with a material with no metal film. However, the emission efficiency is enhanced as compared with an Ir-Au stacked film which has been used for long life. This is included in the scope of the present invention that a wide-bandgap material is used. Since Au or Pt has a low density of states near the Fermi level, the probability of hot electron scattering is small. On the other hand, since the sublimation enthalpy is small, metal atoms are easily migrated into the insulator, so that the life of a thin-film electron emitter is shortened. In the structure of the present invention, a material having a bandgap wider than that of Si is contacted onto the insulator, but Au or Pt is not contacted. This problem will not arise.

As apparent from the above-mentioned description, the present invention is effective for all types of electron emitters in which electrons pass through the electrode, and are emitted outside. Needless to say, these are included in the scope of the present invention. As an example of such as an electron emitter, there is included an electron emitter of a base electrode (metal)—semiconductor (Si)—insulator ($SiO_2$)—top electrode structure described in, for example, Japanese Journal of Applied Physics, Vol. 36, Part 2, No. 7B, pp. L939 to L941 (1997). Otherwise, there is included an electron emitter of a base electrode (semiconductor, Si)—porous (Si)—top electrode structure described in, for example, Japanese Journal of Applied Physics, Vol. 34, Part 2, No. 6A, pp. L705 to L707 (1995).

The thin-film electron emitter according to the present invention has a high electron emission efficiency, and can obtain a high emission current by a low diode current. In addition, the thin-film electron emitter can easily be of thin-film electron emitter arrangement substrate structure arranging thin-film electron emitters in two dimensions. Using this, it is possible to realize a thin-film electron emitter applied display apparatus having long life and high brightness, and a thin-film electron emitter applied machine such as a thin-film electron emitter applied electron-beam lithography apparatus.

For example, the thin-film electron emitter applied display apparatus can be constructed by joining a thin-film electron emitter substrate arranging thin-film electron emitters in two dimensions together with a face plate coated with phosphors via a gap, and by sealing the both, and by pumping out the inside to keep it vacuum.

In addition, the thin-film electron emitter applied electron-beam lithography apparatus can be provided with a thin-film electron emitter and an electron lens acting on an electron beam from the electron emitter. In this case, when using a thin-film electron emitter arrangement substrate arranging thin-film electron emitters in two dimensions, it is possible to obtain a thin-film electron emitter applied electron-beam lithography apparatus which permits simultaneous IC pattern transfer.

The thin-film electron emitter, the thin-film electron emitter applied display apparatus, and the thin-film electron emitter applied machine of the present invention solve the foregoing problems by the following structures.

(1) A thin-film electron emitter having a structure to stack a base electrode, an insulator, and a top electrode in that order which emits electrons from the surface of the top electrode into a vacuum when a voltage of a polarity in which the top electrode is a positive voltage to the base electrode is applied between the base electrode and the top electrode, including: the top electrode having a material with a bandgap wider than that of Si and electrical conductivity as a structuring material.

(2) The thin-film electron emitter according to the (1), wherein the material is GaN or SiC.

(3) The thin-film electron emitter according to the (1), wherein the bandgap :of the material is above 3 eV.

(4) The thin-film electron emitter according to the (3), wherein the resistivity of the material is below $10^-$$\Omega$cm.

(5) A thin-film electron emitter having a structure to stack a base electrode, an insulator, and a top electrode in that order which emits electrons from the surface of the top electrode into a vacuum when a voltage of a polarity in which the top electrode is a positive voltage to the base electrode is applied between the base electrode and the top electrode, including: the top electrode having a conductive oxide as a structuring material.

(6) The thin-film electron emitter according to the (5), wherein the conductive oxide has, as a main component, at least one selected from a group consisting of a tin oxide, an indium oxide, and a zinc oxide, and the top electrode has a single-layer film of the conductive oxide or a multi-layer film thereof.

(7) The thin-film electron emitter according to the (6), wherein antimony is doped into at least part of the tin oxide, tin is doped into at least part of the indium oxide, and aluminum is doped into at least part of the zinc oxide.

(8) A thin-film electron emitter having a structure to stack a base electrode, an insulator, and a top electrode in that order which emits electrons from the surface of the top electrode into a vacuum when a voltage of a polarity in which the top electrode is a positive voltage to the base electrode is applied between the base electrode and the top electrode, including: the top electrode having a conductive boride as a structuring material.

(9) A thin-film electron emitter having a structure to stack a base electrode, an insulator, and a top electrode in that order which emits electrons from the surface of the top electrode into a vacuum when a voltage of a polarity in which the top electrode is a positive voltage to the base electrode is applied between the base electrode and the top electrode, including: the top electrode having a conductive nitride as a structuring material.

(10) A thin-film electron emitter having a structure to stack a base electrode, an insulator, and a top electrode in that order which emits electrons from the surface of the top electrode into a vacuum when a voltage of a polarity in which the top electrode is a positive voltage to the base electrode is applied between the base electrode and the top electrode, including: the top electrode having a stacked film comprising of a film of a material with a bandgap wider than that of Si and electrical conductivity and a metal film.

(11) A thin-film electron emitter having a structure to stack a base electrode, an insulator, and a top electrode in that order which emits electrons from the surface of the top electrode into a vacuum when a voltage of a polarity in which the top electrode is a positive voltage to the base electrode is applied between the base electrode and the top electrode, including: the top electrode having a stacked film comprising of a conductive oxide film and a metal film.

(12) A thin-film electron emitter having a structure to stack a base electrode, an insulator, and a top electrode in that order which emits electrons from the surface of the top electrode into a vacuum when a voltage of a polarity in which the top electrode is a positive voltage to the base electrode is applied between the base electrode and the top electrode, including: the top electrode having a stacked film comprising of a plurality of films selected from a group consisting of a conductive oxide film, a conductive boride film, a conductive nitride film, and metal film.

(13) The thin-film electron emitter according to any one of the (1) to (12), wherein a semiconductor layer is formed between the base electrode and the insulator.

(14) A thin-film electron emitter applied machine including: as an electron emitter, a thin-film electron emitter arrangement substrate arranging a plurality of the thin-film electron emitters according to any one of the (1) to (13).

(15) A thin-film electron emitter applied machine including: as an electron emitter, a thin-film electron emitter arrangement substrate arranging in two dimensions the thin-film electron emitters according to any one of the (1) to (13).

(16) A display apparatus having a thin-film electron emitter arrangement substrate arranging in two dimensions the thin-film electron emitters according to any one of the (1) to (13), a face plate which is coated with phosphors and is disposed opposite to the substrate, and driving circuits.

(17) The display apparatus according to the (16), including: a bus line for feeding an electric current to the top electrode, the bus line being formed on the top electrode on the opposite side to the base electrode.

(18) The display apparatus according to the (17), wherein the bus line is a plating film having the top electrode as a seed film.

(19) An electron-beam lithography apparatus including: the thin-film electron emitter according to any one of the (1) to (13); and an electron lens acting on an electron beam from the electron emitter.

(20) An electron-beam. lithography apparatus including: a thin-film electron emitter arrangement substrate arranging in two dimensions the thin-film electron emitters according to any one of the (1) to (13); and an electron lens acting on an electron beam from the electron emitter.

BEST MODE FOR CARRYING OUT THE INVENTION

First Embodiment

Figure 1A:
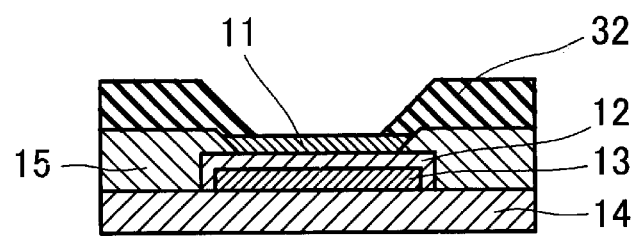
FIG. 1 is a diagram showing a thin-film electron emitter of a first embodiment of the present invention.
Figure 1B:
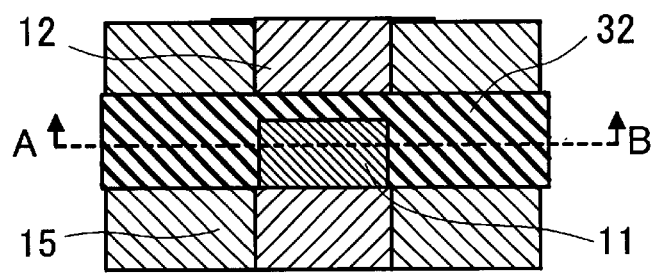
Figure 2:
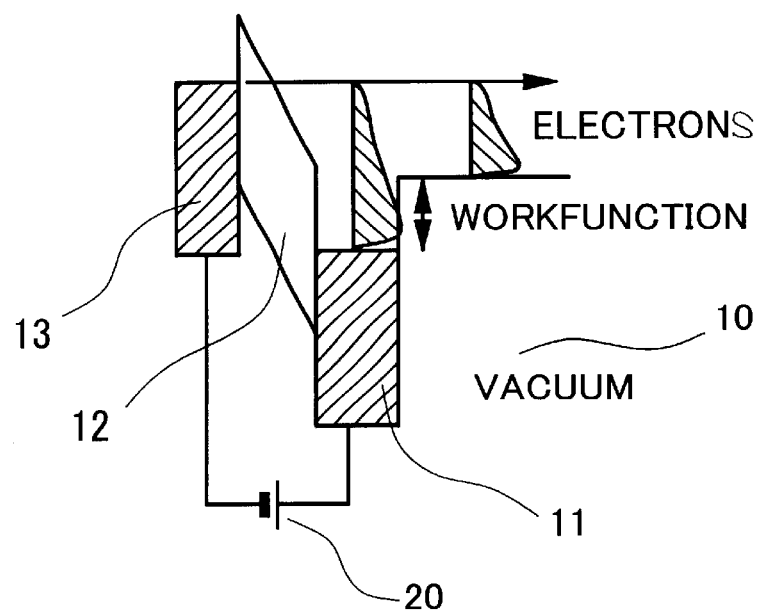
FIG. 2 is a diagram schematically showing the operating principle of the thin-film electron emitter.
Figures 3A, 3B:
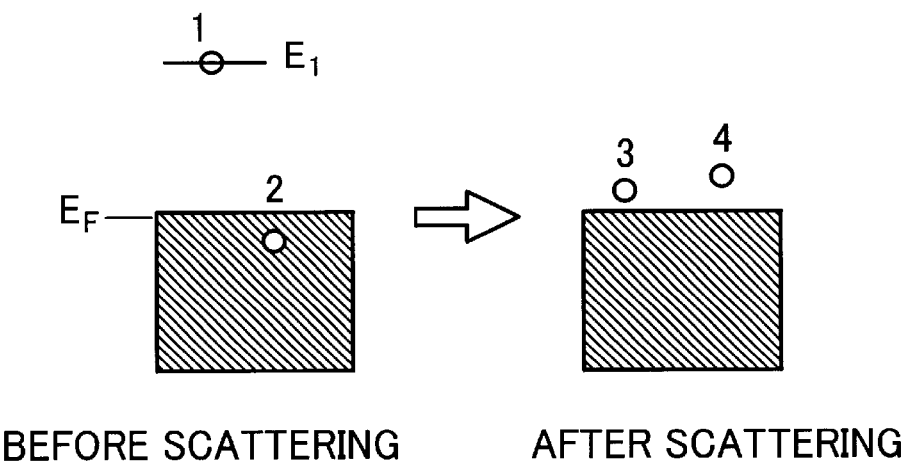
FIG. 3 is an energy state diagram schematically showing the scattering process of hot electrons in a solid.
Figure 4:
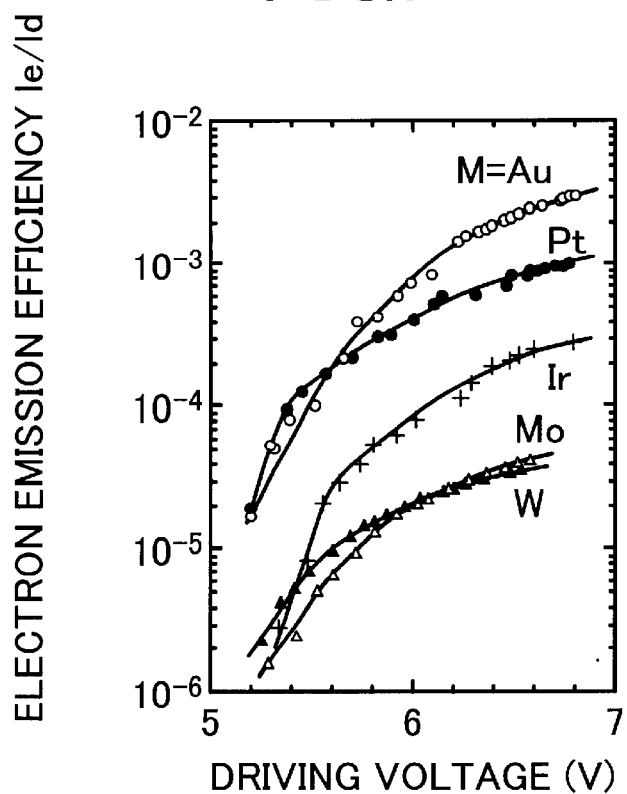
FIG. 4 is a diagram showing the top electrode material dependence of the electron emission efficiency of the thin-film electron emitter.
Figure 5:
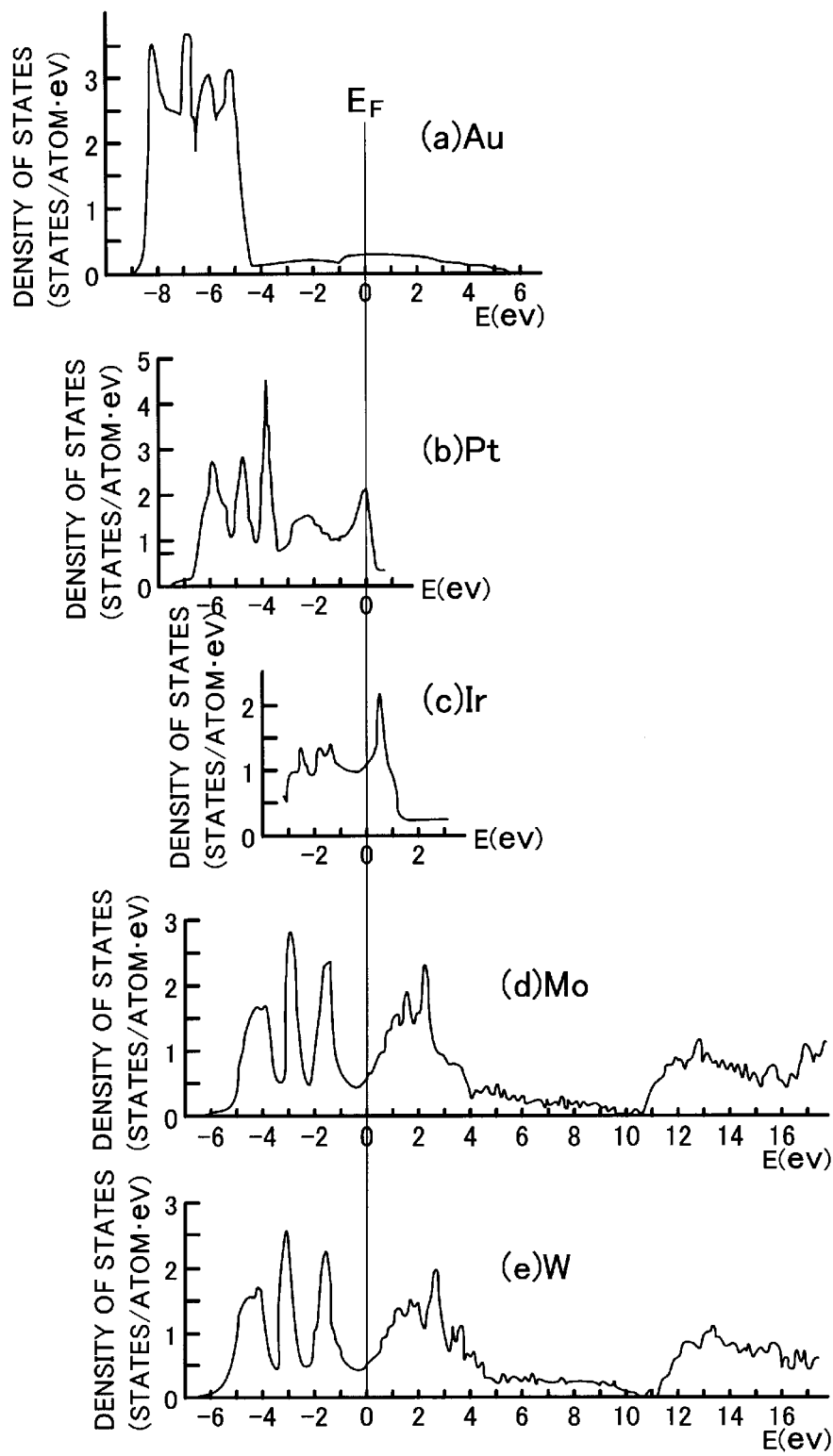
FIG. 5 is a diagram showing the densities of states of various metals.

FIG. 1 shows an example of an MIM electron emitter as an embodiment of a thin-film electron emitter according to the present invention. FIG. 1(b) is a plan view thereof, and FIG. 1(a) is a cross-sectional view taken along line A–B of FIG. 1(b). Al having a film thickness of,. e.g., 100 nm is formed as a base electrode 13 on an insulative substrate 14. To form the Al, for example, an RF magnetron sputtering method is used. The Al surface is anodically oxidized to form an insulator 12 having a film thickness of about 5.5 nm. The anodizing current of anodization is limited to a small value so as to enhance the film quality of the insulator 12. An insulator such as $SiO_2$ or $Al_2O_3$ of about 50 nm is then formed by the RF magnetron sputtering method to be a protection layer 15. Subsequently, an indium tin oxide film of about 10 nm is deposited by the RF magnetron sputtering method to be a top electrode 11. Finally, a top electrode bus line 32 is deposited. The material of the top electrode bus line 32 is, for example, Au.

Figure 6:
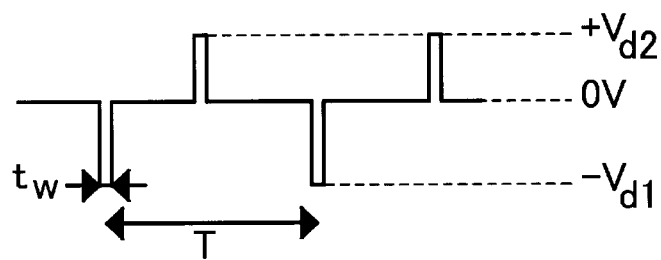
FIG. 6 is a waveform diagram showing a driving voltage waveform used in the present invention.

The thin-film electron emitter thus deposited is placed into a vacuum chamber having a vacuum level of about $1/10^7$ Torr. With the top electrode bus line 32 as a ground potential, a pulse voltage is applied to the base electrode 13. For the pulse voltage, FIG. 6 shows an example of a pulse voltage waveform thereof. A voltage of about—Vd1=–9 V is applied during the period of a pulse width of tw=64 $\mu$s, and then, a voltage of about Vd2=+1 to 5 V is applied during the period of 64 $\mu$s. The entire repeating period T is about 16 ms. Upon application of a negative voltage—Vd to the base electrode 13, electrons are emitted. As described in Japanese Laid-Open Patent Publication No. Hei 7-226146, when a reverse polarity voltage of about Vd2=+1 to 5 V is applied, the operation of the thin-film electron emitter becomes stable.

In this embodiment, when using a highly oriented film or a single crystal film as the base electrode 13, the characteristic of the insulator 12 formed by anodically oxidizing the same is enhanced to obtain a thin-film electron emitter having a higher performance. In place of forming the insulator 12 by anodization, the present invention is effective for an MIM electron emitter formed by using a gas phase synthesis such as a sputtering or evaporation method.

In First Embodiment, the case of using the ITO film as the top electrode 11 is described. $SnO_2$, ZnO, and $Cd_2SnO_4$ may be used as the top electrode 11. In the case of using ZnO, Al-, In-, or Si-doped material may be used. These materials are called a transparent conductive film. In the present invention, they are required to have a wide bandgap, and the optical transmittance needs not to be high.

Second Embodiment

Figure 7:
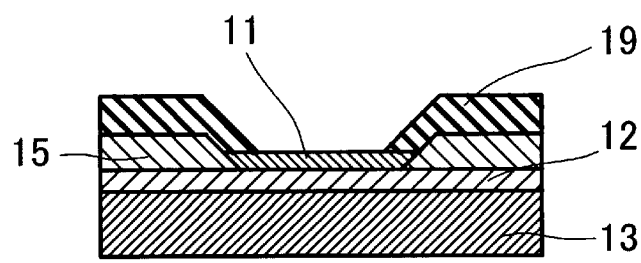
FIG. 7 is a diagram showing a thin-film electron emitter of a second embodiment of the present invention.

FIG. 7 shows an example of an MIS-type electron emitter as an embodiment of the thin-film electron emitter according to the present invention. An n-type Si substrate is a base electrode 13, and the surface thereof is oxidized by a thermal oxidation method to form an insulator 12. An $SiO_2$ film having a film thickness of 50 nm is then evaporated by a CVD or sputtering method to be a protection layer 15. GaN of about 10 nm is formed thereon by a metalorganic chemical vapor deposition (MOCVD) to be a top electrode 11. Finally, a top electrode bus line 32 is manufactured with Au. The present invention is effective for the metal—insulator—semiconductor (MIS) type electron emitter thus manufactured. In place of GaN, SiC may be used for the top electrode 11 by the CVD method.

Third Embodiment

Figure 8:
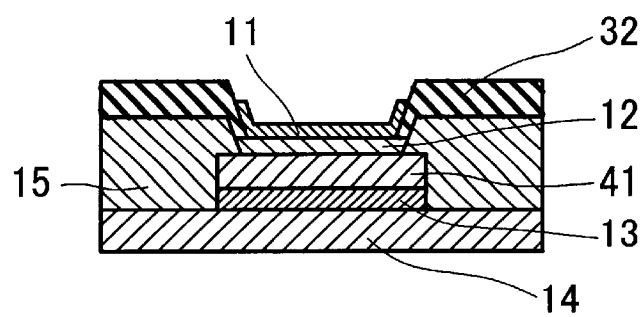
FIG. 8 is a diagram showing a thin-film electron emitter of a third embodiment of the present invention.

FIG. 8 shows an embodiment of the thin-film electron emitter according to the present invention. Al is formed as a base electrode 13 by sputtering on an insulative substrate 14 such as glass. Si of about 5 $\mu$m is deposited thereon to form a semiconductor layer 41, and SiOx of about 400 nm is deposited to be an insulator 12. Thereafter, a bus line 32 is formed by Au. Finally, an ITO film of about 10 nm is deposited by the sputtering method to be a top electrode 11. When a voltage of about –100 V to the top electrode 11 is applied to the base electrode 13 of the thin-film electron emitter thus formed, hot electrons are generated in the insulator 12, which pass through the top electrode 11, and are emitted.

In the above-mentioned embodiments, when desiring to decrease the resistivity depending on the application, a metal such as Au or Pt having a low density of states near the Fermi level may be stacked on a material having a bandgap wider than the Si bandgap. In this case, the electron emission efficiency is naturally lowered as compared with a material with no metal film. However, the emission efficiency is enhanced as compared with an Ir-Au stacked film which has been used for long life. Since Au or Pt has a low density of states near the Fermi level, the probability of hot electron scattering is small. On the other hand, since the sublimation enthalpy of Au and Pt is small, metal atoms are easily migrated into the insulator, so that the life of a thin-film electron emitter is shortened. In the structure of the present invention, a material having a bandgap wider than that of Si is contacted onto the insulator, but Au or Pt is not contacted. This problem will not arise.

An embodiment of an applied machine using the thin-film electron emitter according to the present invention will be explained hereinbelow.

Fourth Embodiment

Figure 9A:
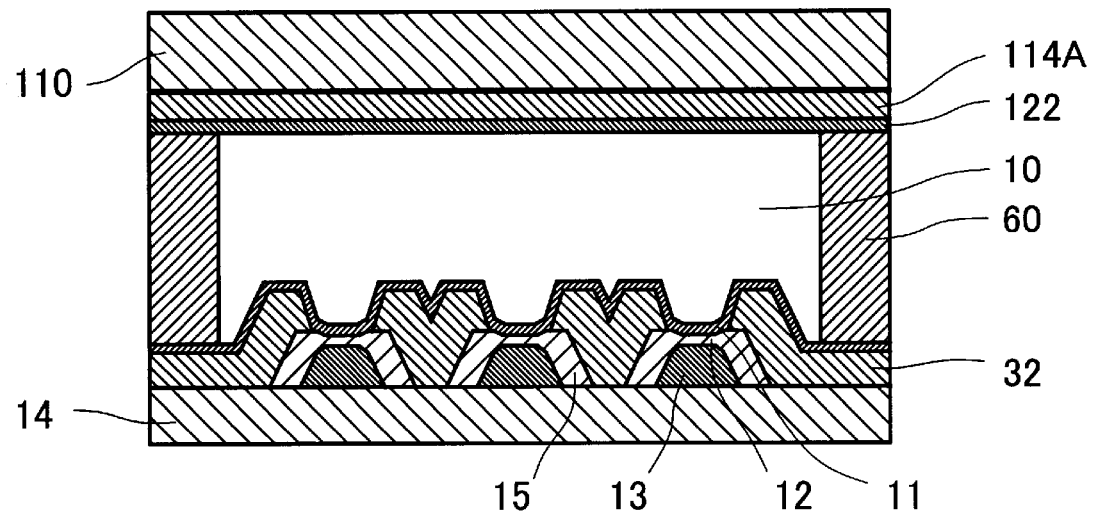
FIG. 9 is a cross-sectional view of a display apparatus of a fourth embodiment of the present invention.
Figure 9B:
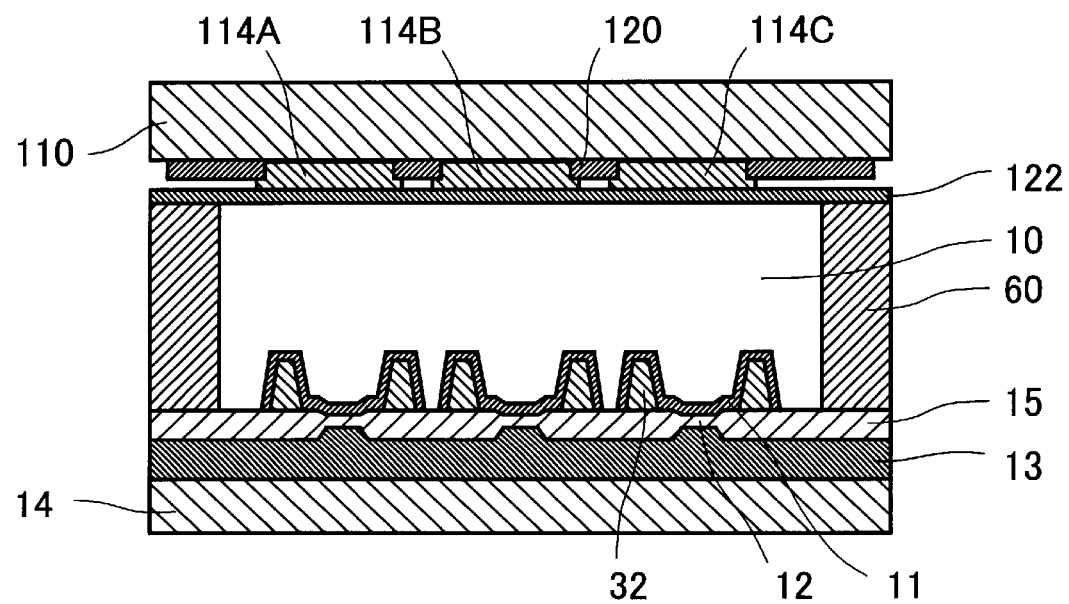
Figure 10:
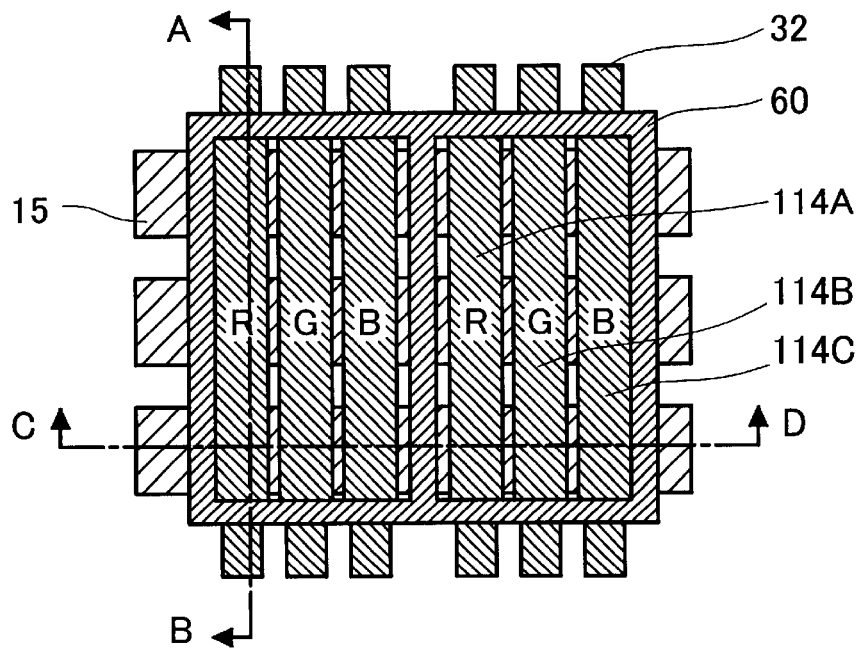
FIG. 10 is a plan view showing phosphor screen positions in the display apparatus of the fourth embodiment.
Figure 11:
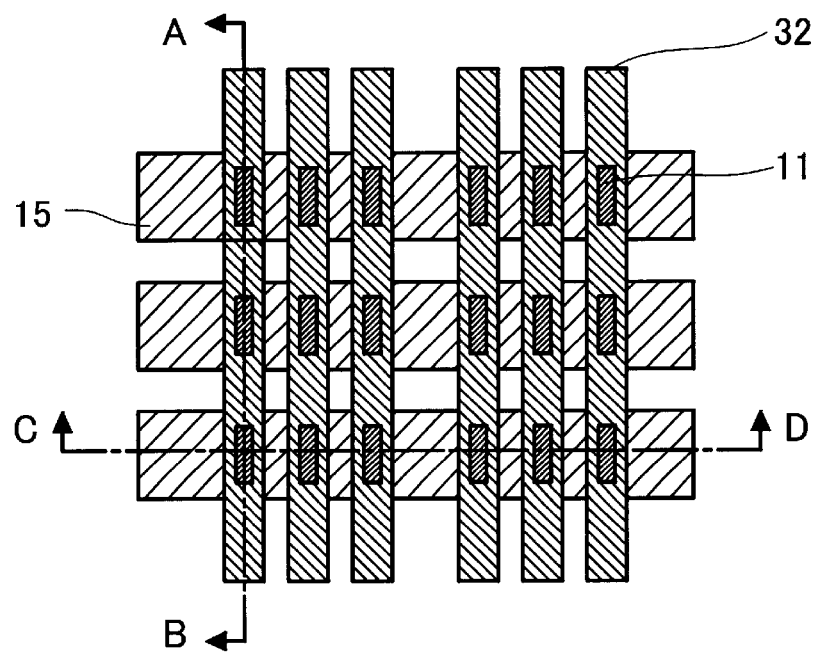
FIG. 11 is a plan view of a substrate in the display apparatus of the fourth embodiment.
Figure 12A:
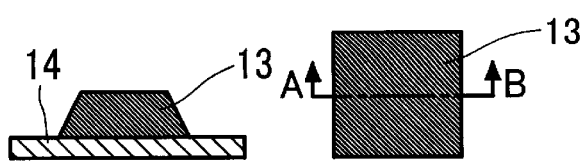
FIG. 12 is a diagram showing a thin-film electron emitter manufacturing process in the display apparatus of the fourth embodiment.
Figure 12B:
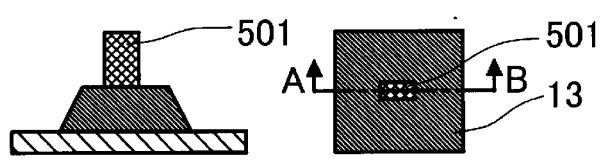
Figure 12C:
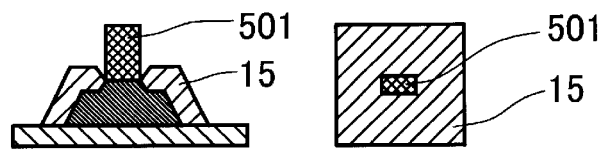
Figure 12D:
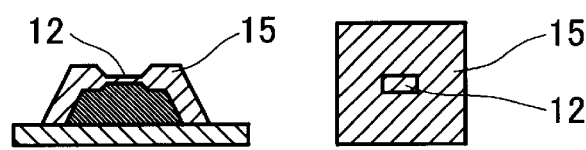
Figure 12E:
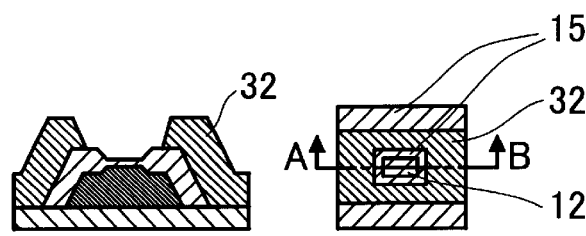
Figure 12F:
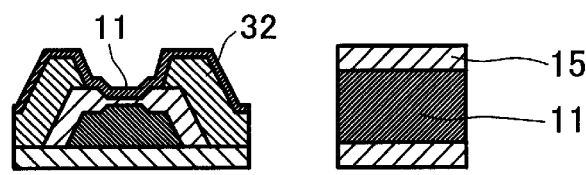

With FIGS. 9, 10, 11, and 12, an embodiment of a display apparatus according to the present invention will be described. FIG. 10 is a plan view of the display panel of the display apparatus viewed from its face plate side. FIG. 11 is a plan view in which the face plate is removed from the display panel and a substrate 14 is viewed from the face plate side of the display panel. FIG. 9(a) is a cross-sectional view taken along line A–B of FIGS. 10 and 11, and FIG. 9(b) is a cross-sectional view of only the left half of the section taken along line C–D of FIGS. 10 and 11 (in FIGS. 10 and 11, the illustration of the substrate 14 is omitted).

A method for manufacturing a thin-film electron emitter formed on a substrate will be described. FIG. 12 shows a process for manufacturing a thin-film electron emitter on a substrate 14. FIG. 12 illustrates that only one electron emitter element formed with one top electrode 11 and one base electrode 13 is taken out from FIGS. 10 and 11. The right column of FIG. 12 shows a plan view of one electron emitter element of FIGS. 10 and 11 rotated at 90° on a vertical line thereof. The left column of FIG. 12 shows a cross-sectional view taken along A–B line of one electron emitter element of FIGS. 10 and 11. FIG. 12 shows only one electron emitter element, but actually plural electron emitter elements are arranged in a matrix form, as shown in FIGS. 9 and 11.

An Al alloy having a film thickness of, e.g., 300 nm is formed as the material for a base electrode 13 on an insulative substrate 14 such as glass. An Al—Nd alloy is used here. To form the Al alloy film, for example, a sputtering or resistive-heating evaporation method is used. The Al alloy film is patterned into in a stripe form by resist forming by means of photolithography followed by etching to form the base electrode 13. The resist used here may be suitable for etching. In the etching, either wet etching or dry etching may be used. This is the state of FIG. 12(*a*).

The base electrode 13 is then coated with a resist to be exposed by ultraviolet ray for patterning, thereby forming a resist pattern 501 of FIG. 12(*b*). As the resist, for example, a quinonediazide positive resist is used. With the resist pattern 501, anodization is performed to form a protection layer 15. In the anodization of this embodiment, an anodizing voltage is about 100 V, and the film thickness of the protection layer 15 is about 140 nm. This is the state of FIG. 12(*c*).

After the resist pattern 501 is removed by an rganic solvent such as acetone, the base electrode 13 urface coated with the resist in FIG. 12(*c*) is nodically oxidized to form an insulator 12. In this embodiment, an anodizing voltage is set to 4 V, and the insulator film thickness is 5.5 nm. This is the state of FIG. 12(*d*).

A material used for a top electrode bus line is deposited, and the resist is patterned for etching, thereby forming a top electron bus line 32. This is the state of FIG. 12(*e*). In this embodiment, the top electrode bus line 32 is formed by a film stacking an Al alloy having a film thickness of about 300 nm and a W film having a film thickness of about 20 nm, and the Al alloy and the W film are etched in two stages. Au may be used for the material of the bus line 32. When etching the top electrode bus line 32, the edge is etched in a taper-shape.

An Sn-doped indium oxide, that is, an ITO (Indium Tin Oxide) film is formed by sputtering. The film thickness of the ITO film is about 10 nm. The ITO film is patterned by resist and etching to be a top electrode 11. This is the state of FIG. 12(*f*), and is a final desired structure.

In the above process, a thin-film electron emitter is completed on the substrate 14. The thin-film electron emitter emits electrons from a region defined by the resist pattern 501. The protection layer 15 as a thick insulator is formed in the peripheral portion of the electron emission region. An electric field applied between the top electrode and the base electrode will not concentrate at the side or corner portions of the base electrode. A stable electron emission characteristic can be obtained over a long time.

A transparent glass is used for a face plate 110 of FIG. 9. To increase the contrast of the display apparatus, a black matrix 120 is formed (FIG. 9(*b*)). The black matrix 120 is placed between phosphors 114, and the description thereof is omitted in FIG. 10.

A red phosphor 114A, a green phosphor 114B, and a blue phosphor 114C are formed. These phosphors are patterned using photolithography as used for the phosphor screen of a typical cathode-ray tube. As the phosphors, for example, $Y_2O_2S$: Eu(P22-R) maybe used for the red color, $Zn_2SiO_4$: Mn(P1-G1) for the green color, and ZnS: Ag(P22-B) for the blue color.

After filming with a nitrocellulose film, Al having a film thickness of about 50 to 300 nm is evaporated onto the entire face plate 110 to be a metal back 122. Thereafter, the face plate 110 is heated to about 400° C. to subject the filming film or an organic such as PVA to pyrolysis. The face plate 110 is thus completed.

The face plate 110 thus manufactured and the substrate 14 interpose spacers 60 therebetween to be sealed using frit glass. The positional relation between the phosphors 114A, 114B, and 114C formed on the face plate 110 and the substrate 14 is as shown in FIG. 10. FIG. 11 shows the pattern of the thin-film electron emitter formed on the substrate 14 corresponding to FIG. 10.

The distance between the face plate 110 and the substrate 14 is about 1 to 3 mm. The spacers 60 are inserted to prevent panel breakage by the force of the atmospheric pressure from outside when the inside of the panel is evacuated. In the case of using glass having a thickness of 3 mm for the substrate 14 and the face plate 110 to manufacture a display apparatus having a display area below about 4 cm×9 cm, the mechanical strength of the face plate 110 and the substrate 14 themselves can withstand the atmospheric pressure. The spacer 60 needs not to be inserted in such a case. The shape of the spacers 60 as shown in FIG. 10. A post of the spacer posts is provided for each dot illuminating in R (red), G (green), and B (blue), that is, for each three-lines of the top electrode 11. The number (density) of the posts may be reduced in the range of withstanding the mechanical strength. It is possible to use the spacer 60 in which a hole of a desired shape exposing the electron emitter element is formed by a sandblasting method into the insulator such as glass or ceramics having a thickness of about 1 to 3 mm. Otherwise, sheet-shape or pillarshape glass or ceramic posts may be arranged to be the spacers 60. In FIG. 10, the spacers 60 are inserted in both the horizontal and vertical directions, but may be inserted only in, e.g., the horizontal direction.

The sealed panel is pumped into a vacuum of about $1×10^{-7}$ Torr and is sealed off. In order to maintain the high vacuum degree in the panel, immediately before or immediately after the sealingoff off, a getter film is formed or a getter material is activated in a predetermined position, not shown, in the panel. In the case of a getter material having, e.g., Ba, as a main component, a getter film can be formed by inductive heating. In this way, a display panel using the thin-film electron emitter is completed.

In this embodiment, since the distance between the face plate 110 and the substrate 14 is long and about 1 to 3 mm, an acceleration voltage to be applied to the metal back 122 can be high and 3 to 6 KV. As described above, phosphors for a cathode-ray tube (CRT) can be used for the phosphors 114.

Figure 13:
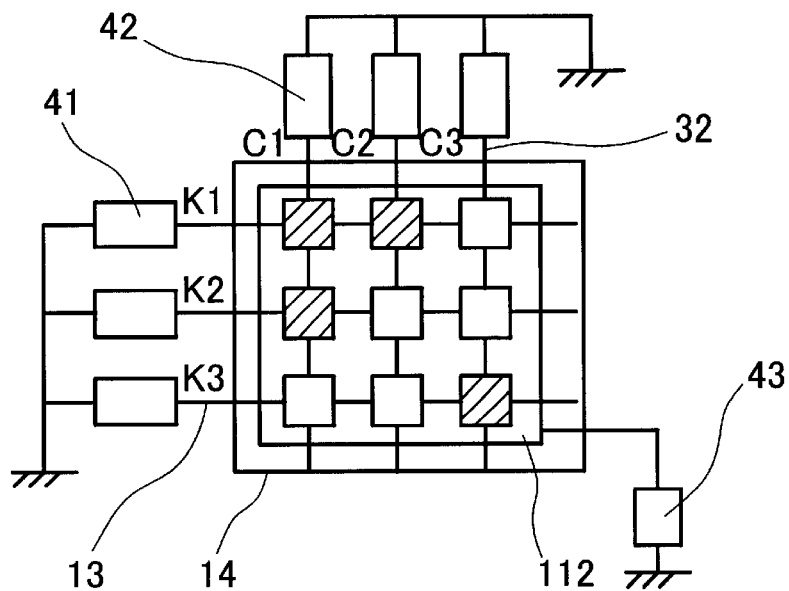
FIG. 13 is a diagram showing connection of the display apparatus of the fourth embodiment to driving circuits.

FIG. 13 is a connection diagram of a display apparatus panel 100 thus manufactured to driving circuits. A base electrode 13 is connected to a base electrode driving circuit 41, and a top electrode bus line 32 is connected to a top electrode driving circuit 42. An acceleration electrode 112 is connected to an acceleration electrode driving circuit 43. The intersection dot of the nth base electrode 13Kn and the mth top electrode bus line 32 Cm is indicated by (n, m).

Figure 14:
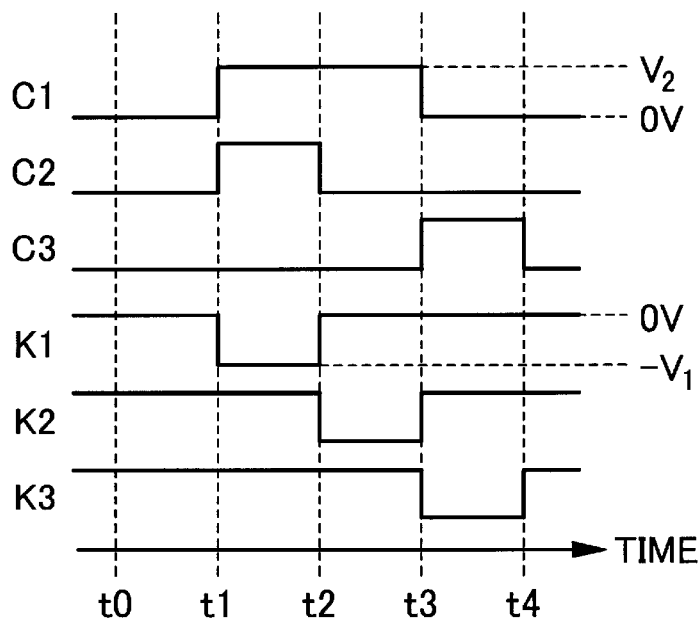
FIG. 14 is a diagram showing driving voltage waveforms in the display apparatus of the fourth embodiment.

FIG. 14 shows waveforms of the generated voltages of the driving circuits. Although not shown in FIG. 14, a voltage of about 3 to 6 KV is always applied to the acceleration electrode 112.

Since no voltage is applied to the electrodes at time t0, no electrons are emitted. The phosphors are not illuminated.

At time t1, a voltage of −V1 is applied to a base electrode 13K1, and a voltage of +V2 is applied to a top electrode bus lines 32C1 and C2. A voltage of (V1+V2) is applied between the base electrode 13 and the top electrode at dots (1, 1) and (1, 2). When the voltage of (V1+V2) is set above the electron emission starting voltage, electrons are emitted from the thin-film electron emitters of the two dots into a vacuum 10.

The emitted electrons are accelerated by the voltage applied to the acceleration electrode 112, and collide with the phosphors 114 to make the phosphors 114 emit light.

At time t2, a voltage of −V1 is applied to a base electrode 13K2, and a voltage of V2 is applied to a top electrode bus line 32Cl. The dot (2,1) lights up. Upon application of the voltage waveform of FIG. 14, only the dots indicated by the slanting lines of FIG. 13 light up.

In this way, a signal applied to the top electrode bus line 32 is changed to display a desired image or information. The,magnitude of the applied voltage V1 to the top electrode bus line 32 is suitably changed corresponding to an image signal. An image with gray scale can be displayed.

When using the thin-film electron emitter of the present invention, a small diode current is enough due to high electron emission efficiency. A requirement for wire resistance of the base electrode 13 and the top electrode bus line 32 can be eased. Further, since a small output current of the driving circuit is enough, the cost can be reduced. Furthermore, when the same diode current as a prior art is kept, the electron emission current is increased according to the enhanced electron emission efficiency, thereby realizing a display apparatus having high brightness.

Fifth Embodiment

Figure 15A:
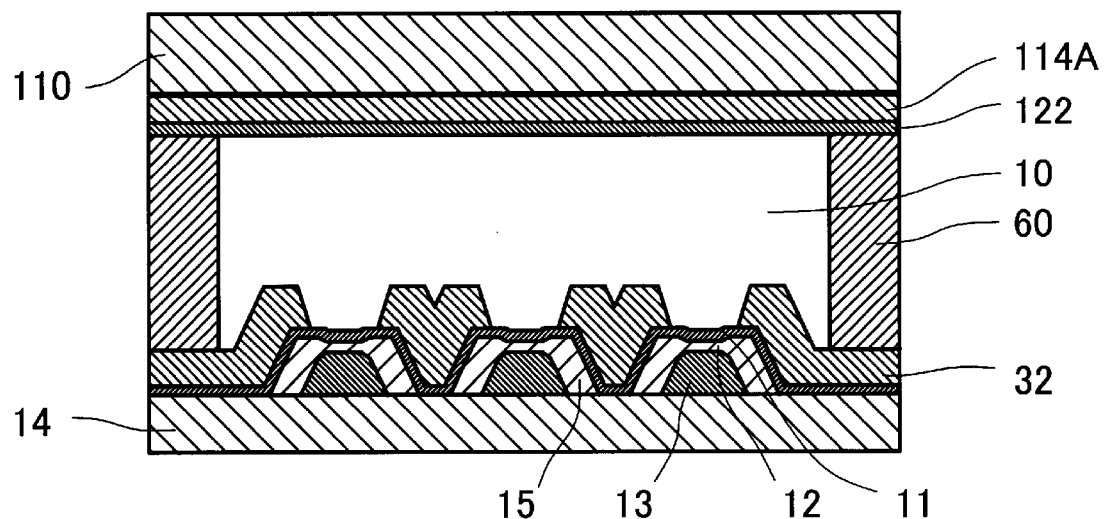
FIG. 15 is a cross-sectional view of a display apparatus of a fifth embodiment of the present invention.
Figure 15B:
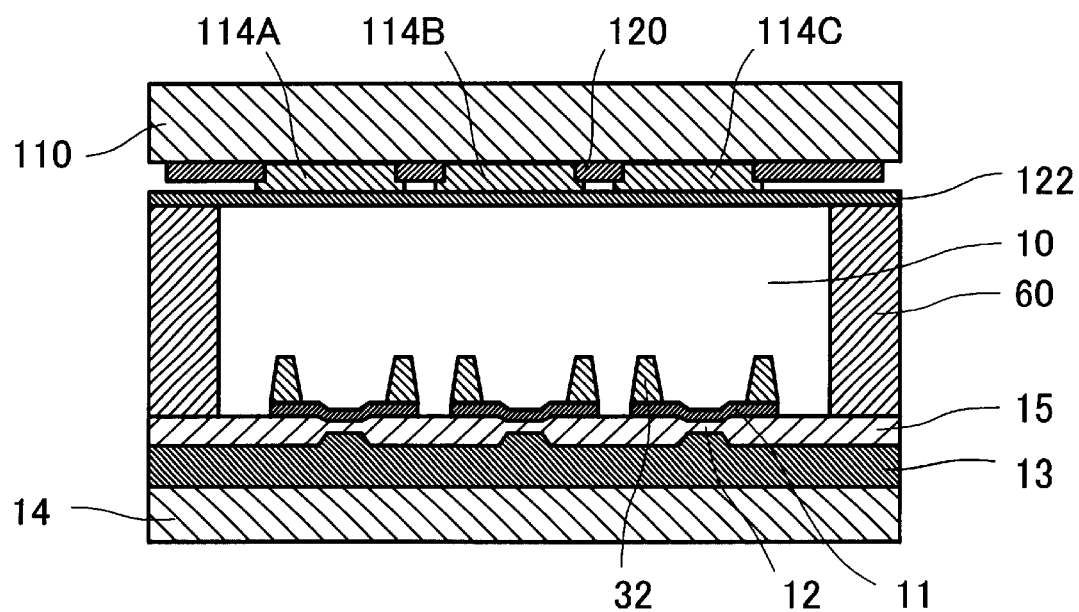
Figure 16A:
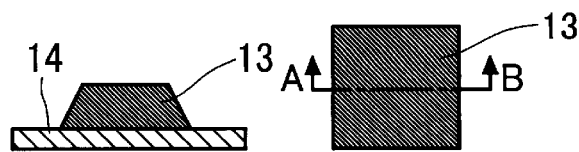
FIG. 16 is a diagram showing a thin-film electron emitter manufacturing process in the display apparatus of the fifth embodiment.
Figure 16B:
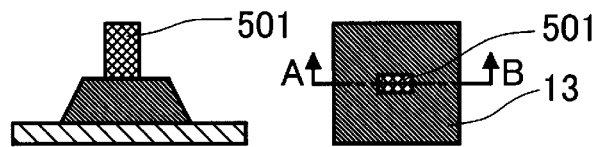
Figure 16C:
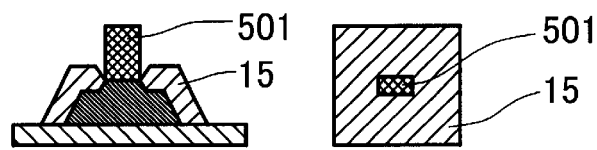
Figure 16D:
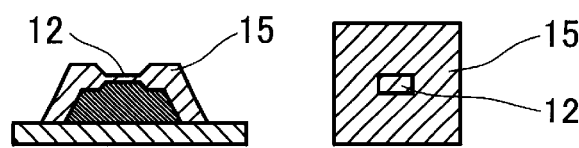
Figure 16E:
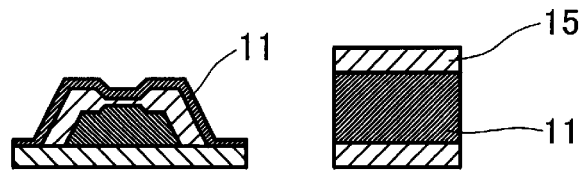
Figure 16F:
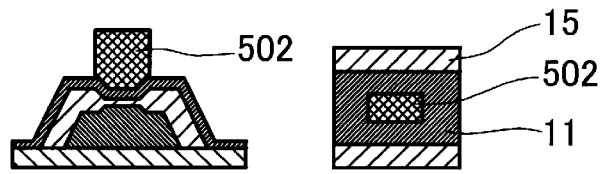
Figure 16G:
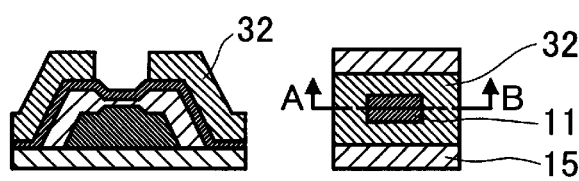
Figure 17A:
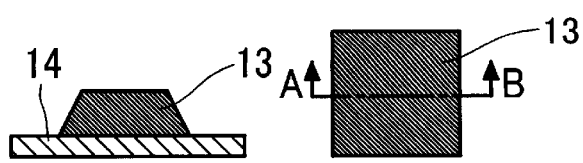
FIG. 17 is a diagram showing a thin-film electron emitter manufacturing process in the display apparatus of the fifth embodiment.
Figure 17B:
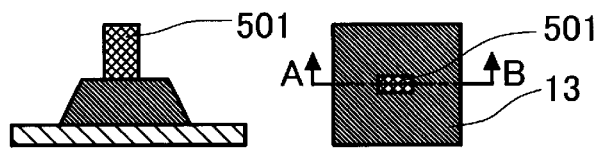
Figure 17C:
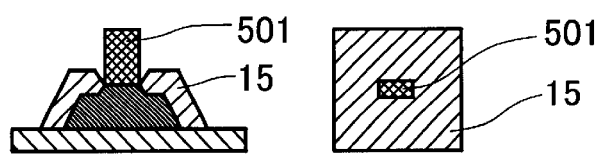
Figure 17D:
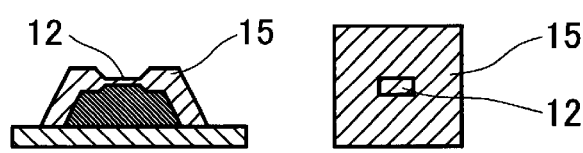
Figure 17E:
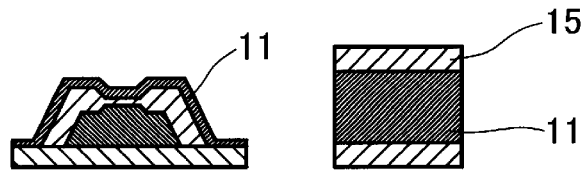
Figure 17F:
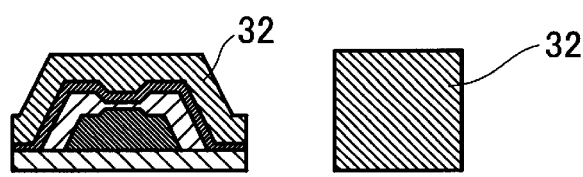
Figure 17G:
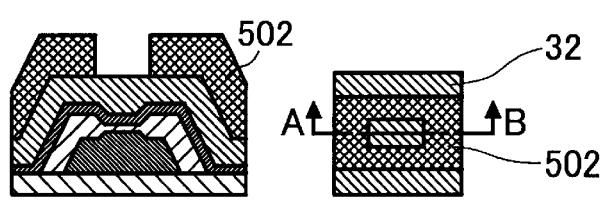
Figure 17H:
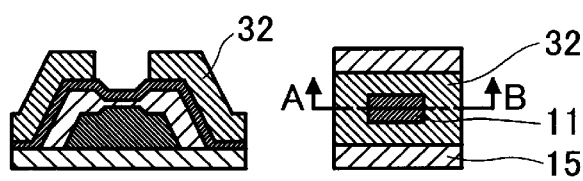
Figure 18:
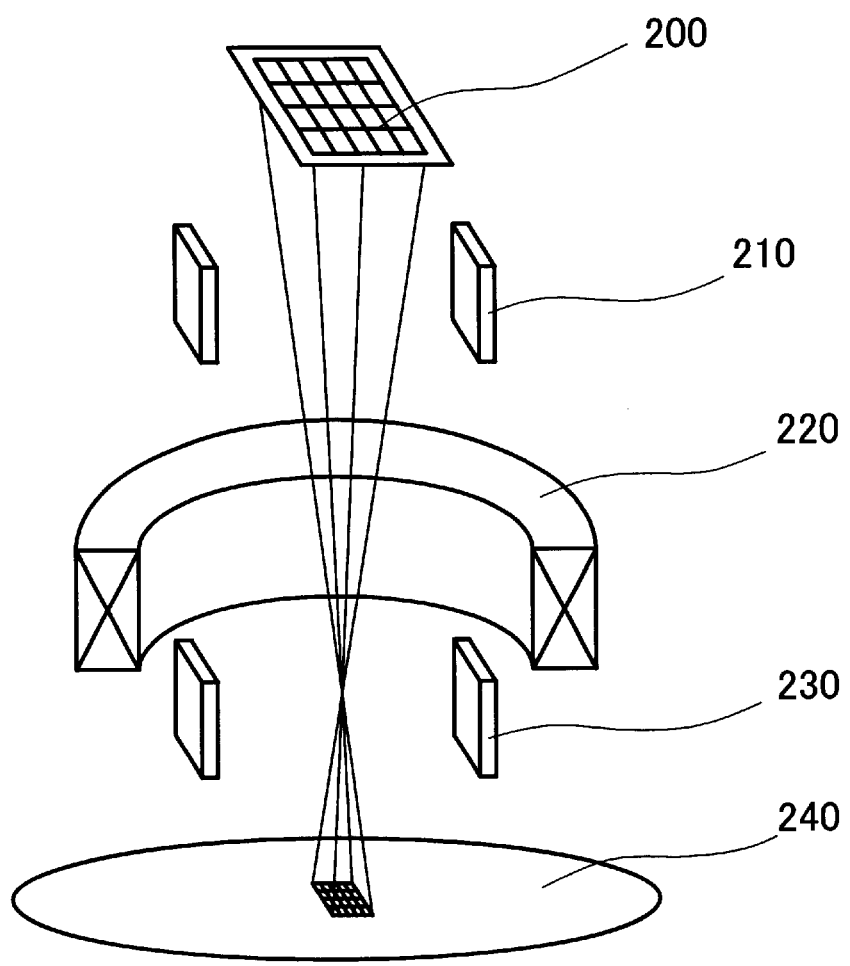
FIG. 18 is a diagram showing an electron-beam lithography apparatus of a sixth embodiment of the present invention.

With FIGS. 10, 11, 15 and 16, another embodiment of the display apparatus according to the present invention will be described. FIG. 10 is a plan view of the display panel of the display apparatus viewed from its face plate;side. FIG. 11 is a plan view in which the face plate is removed from the display panel and a substrate 14 is viewed from the face plate side of the display panel. FIG. 15($a$) is a cross-sectional view taken along line A–B of FIGS. 10 and 11, and FIG. 15($b$) is a cross-sectional view of only the left half of the section taken along line CD of FIGS. 10 and 11 (in FIGS. 10 and 11, the illustration of the substrate 14 is omitted).

A method for manufacturing a thin-film electron emitter formed on a substrate will be described. FIG. 16 shows a process for manufacturing a thin-film electron emitter on a substrate 14. FIG. 16 illustrates only one electron emitter element formed with one top electrode 11 and one base electrode 13, which is taken out from FIGS. 10 and 11. The right column of FIG. 16 shows a plan view of one electron emitter element of FIGS. 10 and 11 rotated at 90° on a vertical line thereof. The left column of FIG. 16 shows a cross-sectional view taken along A–B line of one electron emitter element of FIGS. 10 and 11. FIG. 16 shows only one electron emitter element, but actually plural electron emitter elements are arranged in a matrix form, as shown in FIGS. 11 and 15.

An Al alloy having a film thickness of, e.g., 300 nm is formed as the material for a base electrode 13 on an insulative substrate 14 such as glass. An Al—Nd alloy is used here. To form the Al alloy film, for example, a sputtering or resistive-heating evaporation method is used. The Al alloy film is patterned into a stripe form by resist forming by means of photolithography followed by etching to form the base electrode 13. The resist used here may be suitable for etching. In the etching, either wet etching or dry etching may be used. This is the state of FIG. 16($a$).

The base electrode 13 is then coated with a resist to be exposed by ultraviolet ray for patterning, thereby forming a resist pattern 501 of FIG. 16($b$). As the resist, for example, a quinonediazide positive. resist is used. With the resist pattern 501, anodization is performed to form a protection layer 15. In the anodization of this embodiment, an anodizing voltage is about 100 V, and the film thickness of the protection layer 15 is about 140 nm. This is the state of FIG. 16($c$).

After the resist pattern 501 is removed by an organic solvent such as acetone, the base electrode 13 surface coated with the resist in FIG. 16($c$) is anodically oxidized to form an insulator 12. In this embodiment, an anodizing voltage is set to 6 V, and the insulator film-thickness is 8 nm. This is the state of FIG. 16($d$).

An Sn-doped indium oxide, that is, an ITO (Indium Tin Oxide) film is formed by sputtering. The film thickness of the ITO film is about 10 nm. The ITO film is patterned by resist and etching to be a top electrode 11. This is the state of FIG. 16($e$).

After a resist 502 is formed by the pattern of FIG. 16($f$), a bus line 32 is formed by electroplating. In this embodiment, using a gold electroplating solution, an electric current of about 0.1 A/dm$^2$ is supplied to the top electrode 11 to selectively grow a gold film only on the top electrode 11. In this way, the bus line 32 having a film thickness of about 400 nm is formed. The gold electroplating is used in this embodiment, but other electrode materials such as Cu or Ni may be used.

After forming the bus line 32 by plating, the resist 502 is removed to obtain the structure of FIG. 16($g$). This is a final structure shown in FIG. 15. One feature of this structure is that the top electrode 11 having a small thickness is under the bus line 32 having a large thickness. When the top electrode 11 having a small thickness is formed on the bus line 32, as shown in FIG. 9, the top electrode 11 has easily breaks at a step of the bus line 32. The structures of FIGS. 15 and 16 can greatly reduce the step of the surface of the top electrode 11. A thin film having a thickness below about 10 nm can be reliably formed.

Another point of this embodiment is that the top electrode 11 is used as a seed film to form the bus line 32 by plating. This allows the bus line 32 to be self-align patterned. Pattering can be easy and the reliability can be enhanced. In order to permit this, the top electrode 11 is formed not only in the electron emission region but also in the region where the bus line 32 is formed later.

The bus line 32 can be formed without using plating. This embodiment is shown in FIG. 17. FIGS. 17($a$) to 17($e$) are the same as FIGS. 16($a$) to 16($e$) so as to follow the previous description. Thereafter, for example, W is formed as the bus line 32 by sputtering (FIG. 17($f$)). After the resist 502 is patterned as in FIG. 17($g$), the W is etched with a mixing solution of mmonia and hydrogen peroxide, and the resist is emoved to obtain the structure of FIG. 17($h$).

As described above, the structure constructed on the substrate 14 of the display panel shown in FIG. 15 can be formed. In this thin-film electron emitter, electrons are emitted from a region defined by the resist pattern 501. The protection layer 15 as a thick insulator is formed in the peripheral portion of the electron emission region. An electric field applied between the top electrode and the base electrode will not concentrate at the side or corner portions of the base electrode to obtain a stable electron emission characteristic over a long period.

A method for constructing phosphors 114 on a face plate 110, a method for manufacturing a panel combining a substrate 14, a face plate 110, and spacers 60, and a connecting and driving method to driving circuits are the same as the previously-described embodiments.

Sixth Embodiment

An embodiment of the electron-beam lithography apparatus using the present invention will be described with FIG.

18. At least one electron emitter may be employed in the electron-beam lithography apparatus. In this embodiment, an electron-beam lithography apparatus equipped with a multi-electron emitter unit 200 manufactured by arranging in two dimensions thin-film electron emitters in a lattice form will be described.

The multi-electron emitter unit 200 is similar in driving method described in the embodiments of the display element for emitting an electron beam in an IC circuitry pattern to be subjected to lithography. The electron beam then passes through a blanker 210; after leaving this, the resultant beam is reduced to about 1/100 in diameter by an electron lens 220, which is then deflected by a deflecting system 230 so that the IC circuitry pattern is projected onto a wafer 240. With the electron-beam lithography apparatus for simultaneous IC pattern transfer, the resist exposure time is short due to the fact that the emission current density is high according to the emission efficiency enhanced by the present invention. This may enable throughput to be much improved as compared with prior art electron-beam lithography apparatuses.

As described above, according to the present invention, the thin-film electron emitter can reduce the electron energy loss in the top electrode through which hot electrons pass so as to enhance the electron emission efficiency. This cah obtain a high emission current in the case of using the same diode current as a prior art. In addition, when the same emission current density as a prior art is desired, a driving current smaller than a prior art is enough. The bus line and the driving circuits can be simplified.

What is claimed is:

1. A thin-film electron emitter having a structure to stack a base electrode, an insulator, and a top electrode in that order which emits electrons from the surface of said top electrode into a vacuum when a voltage of a polarity in which said top electrode is a positive voltage to said base electrode is applied between said base electrode and said top electrode, wherein the material of said insulator being $SiO_2$ or $Al_2O_3$; and said top electrode having a material with a bandgap above 3 eV and conductivity as a structuring material.

2. The thin-film electron emitter according to claim 1, wherein said bandgap of said top electrode material is above 3 eV to below 5.5 eV or above 5.5 eV.

3. The thin-film electron emitter according to claim 2, wherein a semiconductor layer is formed between said base electrode and said insulator.

4. The thin-film electron emitter according to claim 2, wherein the resistivity of said material is below $10^{-3} \Omega cm$.

5. The thin-film electron emitter according to claim 4, wherein a semiconductor layer is formed between said base electrode and said insulator.

6. The thin-film electron emitter according to claim 1, wherein a semiconductor layer is formed between said base electrode and said insulator.

7. A thin-film electron emitter applied machine comprising: as an electron emitter, a thin-film electron emitter arrangement substrate arranging a plurality of the thin-film electron emitters according to claim 1.

8. A thin-film electron emitter applied machine comprising: as an electron emitter, a thin-film electron emitter arrangement substrate arranging in two dimensions the thin-film electron emitters according to claim 1.

9. A display apparatus comprising: a thin-film electron emitter arrangement substrate arranging in two dimensions the thin-film electron emitters according to claim 1; a face plate coated with phosphors disposed opposite to the substrate; and driving circuits.

10. The display apparatus according to claim 9, comprising a bus line for feeding an electric current to said top electrode, the bus line being formed on said top electrode on the opposite side of said base electrode.

11. The display apparatus according to claim 10, wherein said bus line is a plating film having said top electrode as a seed film.

12. An electron-beam lithography apparatus comprising: the thin-filn electron emitter according to claim 1; and an electron lens acting on an electron beam from the electron emitter.

13. An electron-beam lithography apparatus comprising: a thin-film electron emitter arrangement substrate arranging in two dimensions the thin-film electron emitters according to claim 1; and an electron lens acting on an electron beam from the electron emitter.

14. A thin-film electron emitter having a structure to stack a base electrode, an insulator, and a top electrode in that order which emits electrons from the surface of said top electrode into a vacuum when a voltage of a polarity in which said top electrode is a positive voltage to said base electrode is applied between said base electrode and said top electrode, wherein the material of said top electrode being GaN or SiC.

15. The thin-film electron emitter according to claim 14, wherein a semiconductor layer is formed between said base electrode and said insulator.

16. A thin-film electron emitter having a structure to stack a base electrode, an insulator, and a top electrode in that order which emits electrons from the surface of said top electrode into a vacuum when a voltage of a polarity in which said top electrode into a positive voltage to said base electrode is applied between said base electrode and said top electrode, wherein the material of said insulator being $SiO_2$ or $Al_2O_3$; and said top electrode having a conductive oxide as a structuring material with a bandgap above 3 eV.

17. The thin-film electron emitter according to claim 16, wherein said conductive oxide has, as a main component, at least one selected from a group consisting of a tin oxide, an indium oxide, and a zinc oxide, and said top electrode has a single-layer film of said conductive oxide or a multi-layer film thereof.

18. The thin-film electron emitter according to claim 17, wherein antimony is doped into at least part of said tin oxide, tin is doped into at least part of said indium oxide, and aluminum is doped into at least part of said zinc oxide.

19. The thin-film electron emitter according to claim 18, wherein a semiconductor layer is formed between said base electrode and said insulator.

20. The thin-film electron emitter according to claim 17, wherein a semiconductor layer is formed between said base electrode and said insulator.

21. The thin-film electron emitter according to claim 16, wherein a semiconductor layer is formed between said base electrode and said insulator.

22. A thin-film electron emitter having a structure to stack a base electrode, an insulator, and a top electrode in that order which emits electrons from the surface of said top electrode into a vacuum when a voltage of a polarity in which said trop electrode is a positive voltage to said base electrode is applied between said base electrode and said top electrode, wherein said top electrode having a conductive nitride as a structuring material with a bandgap above 3 eV.

23. The thin-film electron emitter according to claim 22, wherein a semiconductor layer is formed between said base electrode and said insulator.

24. A thin-film electron emitter having a structure to stack a base electrode, an insulator, and a top electrode in that order which emits electrons from the surface of said top electrode into a vacuum when a voltage of a polarity in which said top electrode is a positive voltage to said base electrode is applied between said base electrode and said top electrode, wherein said top electrode having a stacked film of a film of a material having a bandgap above 3 eV and conductivity and a metal film, and an area of an electron emission region is not more than 1 mm square.

25. The thin-film electron emitter according to claim 24, wherein said bandgap of said top electrode material is above 3 eV to below 5.5 eV or above 5.5 eV.

26. The thin-film electron emitter according to claim 25, wherein the material of said insulator is $SiO_2$ or $Al_2O_3$.

27. The thin-film electron emitter according to claim 24, wherein a semiconductor layer is formed between said base electrode and said insulator.

28. A thin-film electron emitter having a structure to stack a base electrode, an insulator, and a top electrode in that order which emits electrons from the surface of said top electrode into a vacuum when a voltage of a polarity in which said top electrode is a positive voltage to said base electrode is applied between said base electrode and said top electrode, wherein the material of said insulator being $SiO_2$ or $Al_2O_3$; and said top electrode having a stacked film of a conductive oxide film and a metal film so as to provide a bandgap above 3 eV, and an area of an electron emission region is not more than 1 mm square.

29. The thin-film electron emitter according to claim 28, wherein a semiconductor layer is formed between said base electrode and said insulator.

30. A thin-film electron emitter having a structure to stack a base electrode, an insulator, and a top electrode in that order which emits electrons from the surface of said top electrode into a vacuum when a voltage of a polarity in which said top electrode is a positive voltage to said base electrode is applied between said base electrode and said top electrode, wherein said top electrode having a stacked film of a conductive nitride film and a metal film so as to provide a bandgap above 3 eV.

31. The thin-film electron emitter according to claim 30, wherein a semiconductor layer is formed between said base electrode and said insulator.

32. A thin-film electron emitter having a structure to stack a base electrode, an insulator, and a top electrode in that order which emits electrons from the surface of said top electrode into a vacuum when a voltage of a polarity in which said top electrode is a positive voltage to said base electrode is applied between said base electrode and said top electrode, wherein said base electrode and said insulator being contacted to each other; the material of said base electrode being a metal; the material of said insulator being $SiO_2$ or $Al_2O_3$; and said top electrode having a material with a bandgap wider than that of Si and conductivity as a structuring material.

33. The thin-film electron emitter according to claim 32, wherein said bandgap of said top electrode material is wider than that of Si and narrower than 5.5 eV or wider than 5.5 eV.

34. A display apparatus comprising: a thin-film electron emitter arrangement substrate arranging in two dimensions the thin-film electron emitters according to claim 32, a face plate coated with phosphors disposed opposite to the substrate; and driving circuits.

35. A thin-film electron emitter having a structure to stack a base electrode, an insulator, and a top electrode in that order which emits electrons from the surface of said top electrode into a vacuum when a voltage of a polarity in which said top electrode is a positive voltage to said base electrode is applied between said base electrode and said top electrode, wherein said base electrode and said insulator being contacted to each other; the material of said base electrode being a metal; and said top electrode having a material with a bandgap wider than that of Si and conductivity as a structuring material.

36. The thin-film electron emitter according to claim 35, wherein said bandgap of said top electrode material is wider than that of Si and narrower than 5.5 eV or wider than 5.5 eV.

37. The thin-film electron emitter according to claim 36, wherein the material of said insulator is $SiO_2$ or $Al_2O_3$.

38. A thin-film electron emitter having a structure to stack a base electrode, an insulator, and a top electrode in that order which emits electrons from the surface of said top electrode into a vacuum when a voltage of a polarity in which said top electrode is a positive voltage to said base electrode is applied between said base electrode and said top electrode, wherein the material of said insulator being $SiO_2$ or $Al_2O_3$; and said top electrode being a material with a bandgap above 3 eV and conductivity as a structuring material.

39. A thin-film electron emitter according to claim 38, wherein a semiconductor layer is formed between said base electrode and said insulator.

40. A thin-film electron emitter having a structure to stack a base electrode, an insulator, and a top electrode in that order which emits electrons from the surface of said top electrode into a vacuum when a voltage of a polarity in which said top electrode is a positive voltage to said base electrode is applied between said base electrode and said top electrode, wherein the material of said insulator being $SiO_2$ or $Al_2O_3$; and said top electrode being a conductive oxide as a structuring material.

41. A thin-film electron emitter according to claim 40, wherein said conductive oxide has, as a main component, at least one selected from a group consisting of a tin oxide, an indium oxide and a zinc oxide, and said top electrode has a single-layer film of said conductive oxide or a multi-layer film thereof.

42. A thin-film emitter according to claim 40, wherein a semiconductor layer is formed between said base electrode and said insulator.

43. A thin-film emitter having a structure to stack a base electrode, an insulator, and a top electrode in that order which emits electrons from the surface of said top electrode into a vacuum when a voltage of a polarity in which said top electrode is a positive voltage to said base electrode is applied between said base electrode and said top electrode, wherein said base electrode and said insulator being contacted to each other, the material of said base electrode being a metal; the material of said insulator being $SiO_2$ or $Al_2O_3$; and said top electrode being a material with a bandgap wider than that of Si and conductivity as a structuring material.

44. A thin-film electron emitter according to claim 43, wherein said bandgap of said top electrode material is wider than that of Si and narrower than 5.5 eV or wider than 5.5 eV.

45. A thin-film electron emitter having a structure to stack a base electrode, an insulator, and a top electrode in that order which emits electrons from the surface of said top electrode into a vacuum when a voltage of a polarity in which said top electrode is a positive voltage to said base electrode is applied between said base electrode and said top electrode, wherein said base electrode and said insulator being contacted to each other, said base electrode being a metal; and said top electrode being a material with a bandgap wider than that of Si and conductivity as a structuring material.

46. A display apparatus comprising a thin-film electron emitter arrangement substrate arranging in two dimensions the thin-film electron emitter having a structure to stack a base electrode, an insulator, and a top electrode in that order which emits electrons from the surface of said top electrode into a vacuum when a voltage of a polarity in which said top electrode is a positive voltage to said base electrode is applied between said base electrode and said top electrode, wherein said base electrode and said insulator being contacted to each other, the material of said base electrode being a metal; the material of said insulator being $SiO_2$ or $Al_2O_3$; and said top electrode being a material with a bandgap wider than that of Si and conductivity as a structuring material; a face plate coated with phosphors disposed opposite to the substrate; and driving circuits.

* * * * *